United States Patent [19]

King

[11] Patent Number: 4,616,908

[45] Date of Patent: Oct. 14, 1986

[54] MICROLITHOGRAPHIC SYSTEM

[75] Inventor: Michael C. King, Carlisle, Mass.

[73] Assignee: GCA Corporation, Andover, Mass.

[21] Appl. No.: 632,449

[22] Filed: Jul. 19, 1984

[51] Int. Cl.$^4$ ............................ G02B 3/12; G02B 7/00
[52] U.S. Cl. .................................... 350/576; 350/584; 350/589; 350/418; 355/18
[58] Field of Search ............... 350/576, 582, 584, 585, 350/418, 500, 253, 588, 589; 355/18, 53, 54

[56] References Cited

U.S. PATENT DOCUMENTS

| | | | |
|---|---|---|---|
| 1,968,267 | 6/1934 | Straubel | 350/589 |
| 3,498,695 | 3/1970 | Brouwer | 350/418 |
| 3,586,499 | 6/1958 | Gottlieb et al. | 75/123 K |
| 3,788,730 | 1/1974 | Greeleaf | 350/418 |
| 3,944,325 | 3/1976 | Humphrey | 350/500 |
| 3,976,364 | 8/1976 | Lindemann et al. | 350/418 |
| 4,155,642 | 5/1979 | Lacombat et al. | 355/53 |
| 4,168,882 | 9/1979 | Hopkins | 350/573 |
| 4,172,656 | 10/1979 | Lacombat et al. | 355/53 |
| 4,331,388 | 5/1982 | McCrobie et al. | 350/419 |
| 4,477,183 | 10/1984 | Kawamura et al. | 355/53 |

OTHER PUBLICATIONS

Nikar Precision Inc-Description of Pressure Compensated System.

Primary Examiner—Jon W. Henry
Attorney, Agent, or Firm—Henry D. Pahl, Jr.

[57] ABSTRACT

In the microlithographic system disclosed herein, the spaces between elements in a projection lens are filled with flowing helium gas which substantially reduces the refraction errors caused by barometric changes in the atmosphere, even though the portions of the optical path outside the lens are exposed to the atmosphere.

1 Claim, 2 Drawing Figures

MICROLITHOGRAPHIC SYSTEM

BACKGROUND OF THE INVENTION

The present invention relates to microlithographic systems and more particularly to a lens technique which reduces errors caused by barometric changes in the atmosphere in which the microlithographic system operates.

While it has previously been recognized that changes in barometric pressure effect the focus and magnifying properties of lenses, correction for such effects have seldom been attempted or, if attempted, has resulted in extremely expensive and complicated pressure control systems. For example, in the Brouwer U.S. Pat. No. 3,498,695, and in the McCrobie et al. U.S. Pat. No. 4,331,388, systems are disclosed in which the interior of a lens is pressurized with a heavy or dense gas in order to control or utilize the changes in refractive index which accompany such pressurization. A microlithographic system manufactured by Nikon Precision, Inc., is believed to incorporate a automated barometric compensator of the type disclosed in the McCrobie et al. U.S. Pat. No. 4,331,388, with interior lens pressures being adjusted under computer control. In such prior art systems, it is believed that the basic lens design must be substantially modified in order for the control systems to operate as intended.

In sharp contrast with these prior art approaches, the present invention contemplates filling the interior spaces of a microlithographic projection lens with a very low density gas, supplied essentially at atmospheric pressure. As is understood by those skilled in the art, such gases have an index of refraction which is very close to unity so that the barometric effect on the refractive properties of any gas/glass interface is minimal.

Among the several objects of the present invention may be noted the provision of a lens technique for microlithography which reduces the effects of barometric changes in the atmosphere in which the microlithographic systems operates; the provision of such a technique which does not require elaborate pressure control systems; a provision of such a technique which provides a high degree of stability in magnification and focus in a microlithographic lens system; the provision of such a system which does not substantially constrain lens design; the provision of such a technique which is easily implemented, which is highly reliable and which is of relatively simple and inexpensive construction. Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
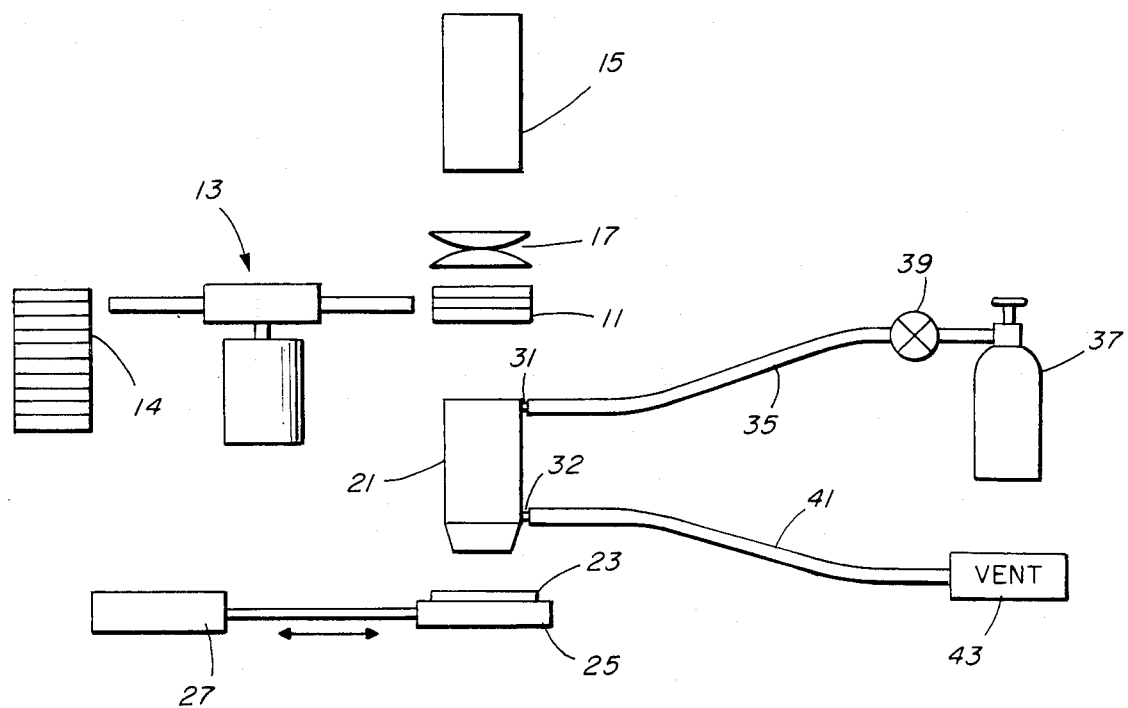
FIG. 1 is a diagramatic illustration of a microlithographic system suitable for exposing semiconductor wafers and employing an optical system in accordance with the present invention.

Referring now to the microlithographic system illustrated in FIG. 1, a reticle holder is indicated generally by reference character 11. Typically, microlithographic systems employed in the manufacture of semiconductor devices utilize an automatic reticle changing system and in FIG. 1, such a system is indicated generally by reference character 13. This changer system may, for example, be of the type disclosed in greater detail in copending, coassigned U.S. patent application Ser. No. 496,819 filed in the name of David Rosenthal on May 23, 1983. This changer system operates to select a desired reticle from a magazine 14 and to transfer the selected reticle to the holder 11.

A light source and condenser lens system 17 are provided for illuminating a reticle held in holder 11. A suitable light source is disclosed in U.S. Pat. No. 4,206,494 issued to Howard B. Lovering on June 3, 1980. A precision projection lens 21 is provided for forming a reduced image of a reticle in holder 11 on the surface of a wafer, designated generally by reference character 23 which is held on a wafer stage 25.

The microlithographic system illustrated is preferably of the so-called step and repeat type which is currently utilized for manufacturing most high density semiconductor products. As is conventional in such systems, the stage 25 is provided with precision x-axis and y-axis traversing capability, the x-axis servo system being indicated diagramatically at reference character 27. Such step and repeat exposure systems are sold by GCA Corporation of Bedford, Mass. under the Trademark DSW. In such systems, only a portion of the wafer surface is exposed at any one time so that, in order to fully utilize the wafer surface, repeated images of the reticle are formed in a regular pattern of successive exposures across the face of the wafer.

As is understood by those skilled in the art, the desire to place ever increasing numbers of electronic elements on each semiconductor chip has caused the semiconductor industry to seek ever finer geometries in the microlithographic systems which form circuit elements on the wafer surface. At present, the geometries are so fine, e.g., under 1.0 micrometer, that hard optical limits are being pushed. Accordingly, extremely complex lenses are required to form the images on the wafer surface with the desired precision and every source of distortion or magnification and focus error is being examined in order to increase the accuracy with which the images are formed and overlaid one over the other, as is required by the successive steps of integrated circuit manufacture.

In accordance with the practice of the present invention, errors caused by barometric changes in the pressure of the atmosphere in which the microlithographic system is operated are effectively reduced in a very simple manner. In particular, all spaces between elements in the lens 21 are filled with flowing helium. For this purpose, the lens 21 is provided with first and second ports, 31 and 33 respectively, which communicate with the interior of the lens system. Port 31 is connected, through tubing 35 and a flow control valve 39, with a source of helium, e.g., a tank 37. Port 32 is connected, through tubing 41, to a venting system, indicated diagramatically at reference character 43 which vents the exiting helium at a point remote from the microlithographic system.

As is understood, the type of microlithographic system contemplated by the present invention is typically located inside an environmental control chamber which, though it maintains clean conditions and an even temperature, is not sealed. Thus, the microlithographic system typically operates in an air atmosphere which is subject to barometric changes and which fills the space between lens 21 and the reticle holder 11 as well as the space between the lens and the wafer stage.

Figure 2:
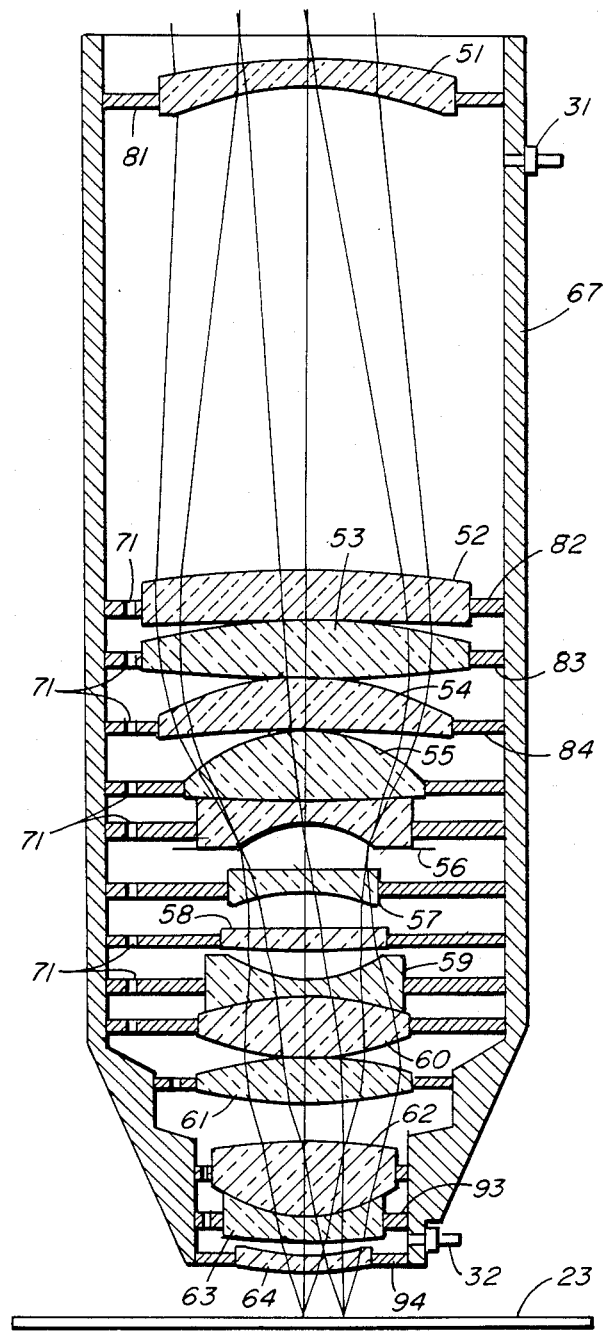
FIG. 2 is a cross-sectional view of a microlithographic projection lens system suitable for use in the practice of the present invention.

The design of lens 21 is shown in greater detail in FIG. 2. As indicated previously, relatively complex lenses are typically employed to achieve the precision desired for integrated circuit manufacture, and this particular lens design employs fourteen glass refractive elements 51-64. The particular lens design illustrated is the 576gx lens manufactured by the Tropel Division of GCA Corporation which is located at Buffalo, N.Y.

The lens elements are supported and enclosed in a lens holder or barrel, designated generally by reference character 67. The individual elements 51-64 are mounted in respective rings 81-94 on the interior of barrel 65. As is understood, these rings will typically be threaded and engage the interior of the cylindrical lens casing though this threading is not shown in FIG. 2.

As indicated previously, the end-most elements 51 and 64 are essentially sealed to the lens barrel 67, while all the intermediate rings are vented. In FIG. 2, this venting is diagramatically illustrated by holes 71 through each ring, though it should be understood that the conventional mounting rings typically employed may be readily constructed so that they do not seal, without the need for separate venting holes. As is understood, venting is relatively simple since helium is a light, very mobile gas and it is more difficult to effectively seal than to not seal.

In order to insure that all of the interior spaces between the multiple lens elements are filled with helium, a constant flow of gas is provided to the lens assembly. As indicated previously, this flow is metered by the flow control valve 39. Contrary to the teachings of the prior art patents discussed previously, it is not necessary to precisely control the pressure of the helium gas within the lens assembly 21, but rather the flow is allowed to merely vent to the atmosphere, e.g., through the second port 32, tubing 41 and external vent 43. Thus, the pressure within the lens will be essentially at atmospheric and will tend to track the barometric changes in the atmospheric pressure.

On the other hand, even though no elaborate pressure control is required, the use of helium in filling the interior spaces of the lens 21 greatly reduces and effectively eliminates for practical purposes the effects of barometric changes in the atmospheric environment in which the microlithographic system operates. For example, with the Tropel 576gx lens mentioned previously, a barometric pressure change of 50 mm of mercury, i.e., from 710 mm to 760 mm, results in a back focus change of −5.97 micrometers, whereas the change with helium filling in the lens is only −1.06 micrometers. Similarly, the change in magnification referenced to lateral movement of a reference point at 11 mm from the objective, is reduced from 0.42 micrometers to 0.15 micrometers.

While the introduction of helium somewhat changes the nominal focal length and magnification of the lens, the change is relatively small and can typically be accommodated by the adjustment of spacing of the elements along the axis in the same manner as adjustments are made for typical manufacturing tolerances in the lens elements themselves. Thus, it can be seen that lens design is essentially free as compared with systems in which heavy gases are utilized and the whole lens design must be configured to work with the pressure control system.

As the neutralizing effects of the helium filling are, as will be understood by those skilled in the art, a function of the curvatures of the optical elements which interface with the gas filling, it should be understood that neutral optical elements, e.g., pelicles, may easily be employed in conjunction with the practice of the present invention, particularly as the end-most elements of the overall lens.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. In a microlithographic system for projecting a reduced image of a reticle onto the surface of a semiconductor wafer for creating circuit patterns thereon, an optical system comprising:

a reticle holder;

aligned with said reticle holder, a wafer stage;

on the axis between said reticle holder and wafer stage, a lens for projecting an image of a reticle held in said holder onto a wafer held on said stage, said lens comprising a plurality of spaced, axially-aligned, optically-transmissive, refractor elements and tubular lens holder means for supporting and enclosing said elements, the holder means being essentially sealed to the two endmost of said elements, the interior spaces between successive elements being vented to each other;

first port means communicating with the interior of said holder means between one endmost element and the respective adjacent element;

second port means communicating with the interior of said holder means between the other endmost element and the respective adjacent element;

means for applying a controlled flow of helium gas to said first port means; and means for venting helium from said holder through said second said port means, the space between the lens and the reticle holder and the space between the lens and wafer stage being open to the atmosphere and subject to barometric changes.

* * * * *